(12) United States Patent
Kawamoto et al.

(10) Patent No.: US 8,974,913 B2
(45) Date of Patent: Mar. 10, 2015

(54) CHASSIS FOR ELECTRONIC APPARATUS

(71) Applicant: Panasonic Corporation, Kadoma-shi, Osaka (JP)

(72) Inventors: Tetsuya Kawamoto, Osaka (JP); Yoshinari Matsuyama, Osaka (JP); Yoshiaki Nagamura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 14 days.

(21) Appl. No.: 13/748,060

(22) Filed: Jan. 23, 2013

(65) Prior Publication Data

US 2013/0189537 A1   Jul. 25, 2013

(30) Foreign Application Priority Data

Jan. 24, 2012 (JP) .................................. 2012-012166

(51) Int. Cl.
*H05K 5/04* (2006.01)
*G06F 1/16* (2006.01)

(52) U.S. Cl.
CPC ................ *H05K 5/04* (2013.01); *G06F 1/1616* (2013.01); *G06F 1/1656* (2013.01)
USPC .......................................... 428/600; 428/573

(58) Field of Classification Search
None
See application file for complete search history.

(56) References Cited

U.S. PATENT DOCUMENTS

| | | | |
|---|---|---|---|
| 3,824,664 A * | 7/1974 | Seeff | ............................. 428/604 |
| 2003/0137801 A1 | 7/2003 | Shimada et al. | |
| 2008/0024965 A1 | 1/2008 | Iwamoto et al. | |
| 2011/0031778 A1* | 2/2011 | Edwards et al. | ........... 296/183.1 |

FOREIGN PATENT DOCUMENTS

| | | |
|---|---|---|
| JP | 2000-22348 | 1/2000 |
| JP | 2001-334356 | 12/2001 |
| JP | 2003-204174 | 7/2003 |
| JP | 2007-293808 | 11/2007 |

\* cited by examiner

*Primary Examiner* — Adam Krupicka
(74) *Attorney, Agent, or Firm* — Hamre, Schumann, Mueller & Larson, P.C.

(57) ABSTRACT

There is provided a thin-plate shaped chassis for an electronic apparatus, which has a plurality of step portions extended substantially in parallel with each other in such a way as to form at least one bulge portion which is bulged in a convex shape. The step portions are formed to have a larger thickness than that of other thin-plate portion having a predetermined thickness, and wherein there is provided at least one rib having a predetermined height which extends from the step portion to the thin-plate portion.

16 Claims, 6 Drawing Sheets

CHASSIS FOR ELECTRONIC APPARATUS

BACKGROUND OF THE INVENTION

1. Field of the Invention

The present disclosure relates to a chassis for electronic apparatus and, more particularly, relates to that for such as a laptop personal computer (hereinafter, appropriately abbreviated as "laptop PC"), for example.

2. Description of the Related Art

In recent years, electronic apparatuses such as, for example, laptop PCs and, particularly, small-sized electronic apparatuses have been increasingly reduced in weight and thickness, for example, in order to enhance their portability and the like. As one measure therefor, the chassis which form the outer shells of such apparatuses have been increasingly reduced in thickness. On the other hand, such chassis are requested to have a required mechanical strength and rigidity and, a required electromagnetic shielding property, furthermore, requested to effectively dissipate heat generated inside the apparatuses.

Therefore, particularly in recent years, metals have been employed as materials of chassis, in many cases. As metal materials for use in such chassis, there have been light metals such as aluminum (Al) and magnesium (Mg), or alloys thereof. In general, casting or molding process has been employed for performing basic shaping.

An electronic apparatus such as a laptop PC generally includes a thin-type display section constituted by liquid crystal display panel and the like, and the chassis housing the display section in such a way as to cover its rear surface is requested to have a required mechanical strength and rigidity enough to protect the display section against external pressures, particularly, in addition to a required electromagnetic shielding property and a required heat dissipation property.

It is known that, conventionally, in a portable-type electronic apparatus, particularly, in order to ensure a required mechanical strength and rigidity while attaining thickness reduction in the apparatus, its thin-plate-shaped chassis is provided with a plurality of step portions extended substantially in parallel with each other in such a way as to form at least a bulge portion which bulges in a convex shape so that the chassis has a basic structure similar to that of an automobile bonnet, thereby ensuring that it has required rigidity while having a reduced thickness (refer to Japanese Patent Laid-open Publication No. 2003-204174, for example).

As a method for fabricating chassis having such bonnet-like basic structure, there has been widely employed a molding method which injects molten material in a molten state or a semi-molten state into predetermined molding die. In this case, a plurality of step portions is molded in such a way as extends along the direction of the flow of the molten material, in general.

SUMMARY OF THE INVENTION

In such a chassis having a bonnet-like basic structure, it may be conceivable to design so that each step portion has a larger thickness than that of other thin-plate portions for reinforcing them and, thereby the thickened step portion can be caused to play a role as elongated "cross rail", in order to further enhance the strength and the rigidity of the entire chassis.

However, if some portions of the chassis are made to have an increased thickness as described above, this tends to induce differences in the flow velocity of a molten material during molding, between these thickened portions and other thin-plate portions. That is, the molten material flows at a relatively-higher velocity along the thickened step portions, while the molten material flows at relatively-lower velocities in the other thin-plate portions. Further, if there is an excessive difference in molten-material flow velocity therebetween, this disadvantageously tends to induce defects such as so-called "shrinkage voids" (partial depressions), in the molded article.

One non-limiting and exemplary embodiment provides a chassis which is capable of suppressing differences in molten-material flow velocity between step portions having an increased thickness and other thin-plate portions, even when the step portions are made to have a larger thickness than those of the other thin-plate portions, in a thin-plate-shaped chassis for an electronic apparatus, which has the plurality of step portions extended substantially in parallel with each other in such a way as to form at least one bulge portion which is bulged in a convex shape.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

According to one general aspect (a first aspect) of the present disclosure, there is provided a thin-plate-shaped chassis for an electronic apparatus, which has a plurality of step portions extended substantially in parallel with each other in such a way as to form at least one bulge portion which is bulged in a convex shape, wherein the step portions are formed to have a larger thickness than those of other thin-plate portions having a predetermined thickness, and wherein there is provided at least one rib having a predetermined height which extends from the step portion to the thin-plate portion.

Further, according to another general aspect (a second aspect) of the present disclosure, there is provided a thin-plate shaped chassis for an electronic apparatus, which has a plurality of step portions extended substantially in parallel with each other in such a way as to form at least one bulge portion which is bulged in a convex shape, wherein the step portions are formed to have a larger thickness than those of other thin-plate portions having a predetermined thickness, and wherein the step portion is provided with at least one rib having a predetermined height which extends in a direction intersecting with the direction of extension of the step portion.

According to the first aspect of the present disclosure, there is provided the rib having the predetermined height which extends from the step portion to the other thin-plate portion, which can cause portions of the molten material flowing along the thickened step portion to dispersedly flow to the other thin-plate portion, during the molding. That is, it is possible to reduce the molten-material flow velocity difference between the thickened step portion having the increased thickness and the other thin-plate portion.

This can effectively suppress the occurrence of defects such as so-called "shrinkage voids" in the molded chassis, while causing the thickened step portion to play a role as elongated cross rails for attaining further improvement in the strength and the rigidity of the entire chassis. This can further stabilise the fabrication processes for the chassis.

Further, according to the second aspect of the present disclosure, the step portion is provided with the rib having the predetermined height which extends in the direction intersecting with the direction of the extension of the step portions. Thus, during the molding, the ribs obstruct, to some degree, flows of the molten material flowing along the step portion having the increased thickness, which can cause portions of the flowing molten material to dispersedly flow to the other thin-plate portion. That is, it is possible to reduce the molten-material flow velocity difference between the step portions having the increased thickness and the other thin-plate portions.

This can effectively suppress the occurrence of defects such as so-called, "shrinkage voids" in the molded chassis, while causing the thickened step portions to play a role as elongated cross rails for attaining further improvement in the strength and the rigidity of the entire chassis. This can further stabilize the fabrication processes for the chassis.

DETAIL DESCRIPTION

Figure 1:
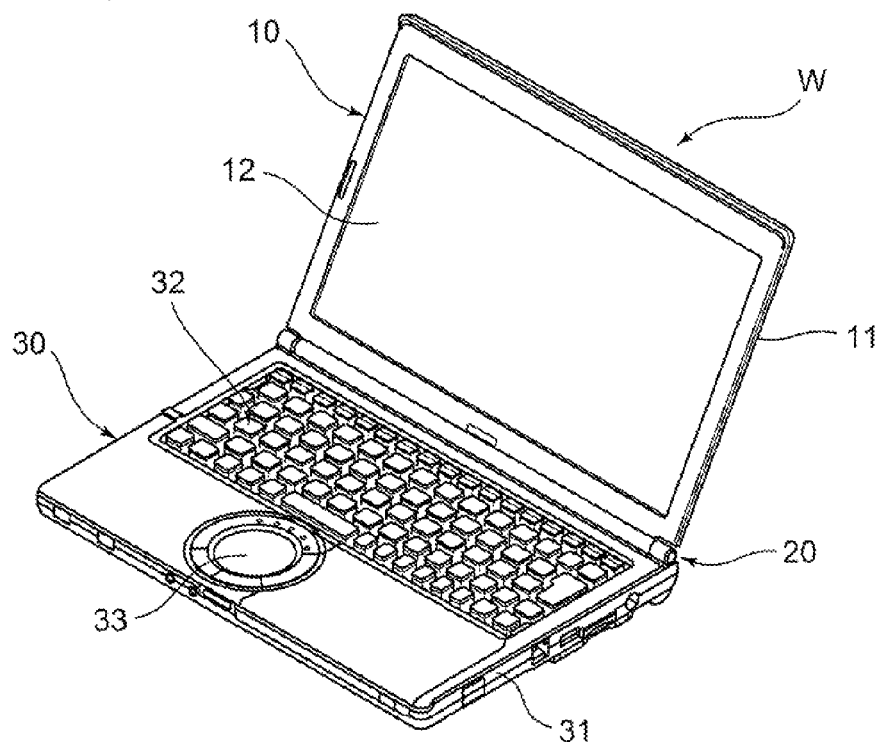
FIG. 1 is an overall perspective view illustrating a laptop PC in a state where it can be used, according to a first embodiment of the present disclosure.

The chassis for the electronic apparatus according to the first aspect of the present disclosure can be provided to have the aforementioned basic structure, in aspects as follows. That is, for example, the chassis may be molded by injecting a molten material in a molten state or a semi-molten state into a predetermined molding die, and the step portions are extended along the direction of a flow of the molten material.

With this structure, more specifically, it is possible to offer the same effects as those of the first aspect, in cases where the chassis is molded by injecting a molten material in a molten state or a semi-molten state into a predetermined molding die, and the step portions are extended along the direction of a flow of the molten material.

In this case, for example, wherein the rib extends in a diagonal direction with respect to the direction of extension of the step portions such that the rib is gradually further spaced apart from the step portion as it proceeds in the direction of the flow of the molten material.

With this structure, since the rib extends in the diagonal direction with respect to the direction of the extension of the step portions as described above, it is possible to smoothly and dispersedly flow portions of the molten material to the other thin-plate portions, such that the molten material gradually gets farther away from the step portion as it flows.

Further, the chassis for the electronic apparatus chassis according to the second aspect of the present disclosure can be provided to have the aforementioned basic structure, in aspects as follows. That is, for example, the chassis is molded by injecting a molten material in a molten state or a semi-molten state into a predetermined molding die, and the step portions are extended along the direction of a flow of the molten material.

With this structure, more specifically, it is possible to offer the same effects as those of the first aspect, in cases where the chassis is molded by injecting a molten material in a molten state or a semi-molten state into a predetermined molding die, and the step portions are extended along the direction of a flow of the molten material.

In this case, for example, the rib extends in a direction orthogonal to the direction of extension of the step portions.

With this structure, since the ribs extend in the direction orthogonal to the direction of the extension of the step portions, it is possible to effectively obstruct flows of the molten material flowing along the step portions having the increased thickness. This enables reducing the height of the ribs by an amount corresponding thereto. This can inhibit the ribs provided on the step portions from obstructing the thickness reduction in the chassis.

Further, in the aforementioned cases, for example, the molten material may be a material selected from a material group including aluminum, alloys of aluminum, magnesium, and alloys of magnesium.

In this case, it is possible to fabricate the chassis, by employing the aforementioned light metals or alloys thereof which have sufficient actual performance in the past and have sufficient marketability.

EMBODIMENTS

Hereinafter, embodiments of the present disclosure will be described, in detail, by exemplifying a so-called laptop PC, with reference to the accompanying drawings.

Further, in the following description, terms which denote certain directions (such as "upper", "lower", "left", "right" and other terms including these terms, "clockwise", "counterclockwise") may be used, but the use of them is merely for ease of understanding of the disclosure with reference to the drawings, and the present disclosure should not be restrictively understood by the meanings of these terms.

Figure 2:
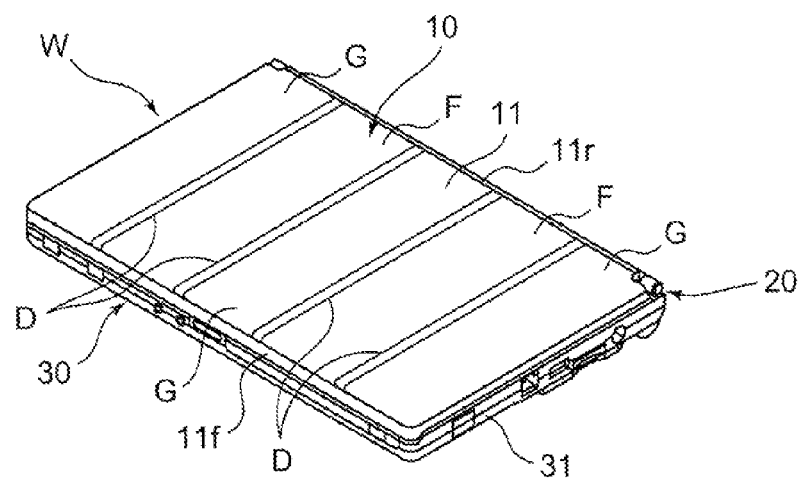
FIG. 2 is an overall perspective view illustrating the laptop PC in an unused state.
Figure 3:
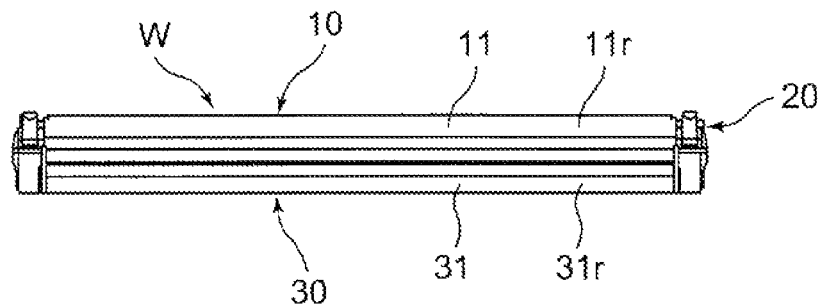
FIG. 3 is a rear view illustrating the laptop PC in an unused state.

A first embodiment of the present disclosure will be firstly described. FIG. 1 and FIG. 2 are perspective views illustrating the laptop PC according to the first embodiment of the present disclosure, in a state where it can be used (an opened state), and in a state where it is unused (a closed state), respectively. Further, FIGS. 3, 4, 5, 6 and 7 are a backside view, a plan view, a front view, a side view and a bottom view of the laptop PC in the unused state. Further, as to the side views, FIG. 6A illustrates a left side view, and FIG. 6B illustrates a right side view.

As illustrated in these figures, the laptop PC W as an electronic apparatus according to the present embodiment includes a display section 10 having a display screen 12 of a liquid crystal type, for example, and, further, includes an operation control section 30 capable of creating display signals to be inputted to the display section 10. The operation control section 30 includes an input device 32 such as a keyboard, signal processing circuits for creating display signals to be outputted to the display section based on inputting operations performed through the input device 32, a central processing unit (so-called CPU), peripheral components therefor (which are not illustrated), and the like. Further, in an operation state where a user (a person who uses the laptop PC) operates the laptop PC W, a touch pad 33 is provided in front of the keyboard 32 when viewed from the user, which enables the user to perform moving of a cursor, scrolling of the display screen 12, and the like, only by stroking the touch pad 33 upwardly, downwardly, leftwardly and rightwardly.

The display section 10 is housed within a display-portion-side chassis 11 (a first chassis) and is covered therewith at its peripheral edges and its rear surface. On the other hand, the operation control section 30 is housed within an operation-control-section-side chassis 31 (a second chassis). Both the chassis 10 and 30 are openably coupled to each other through a hinge mechanism 20.

Figure 4:
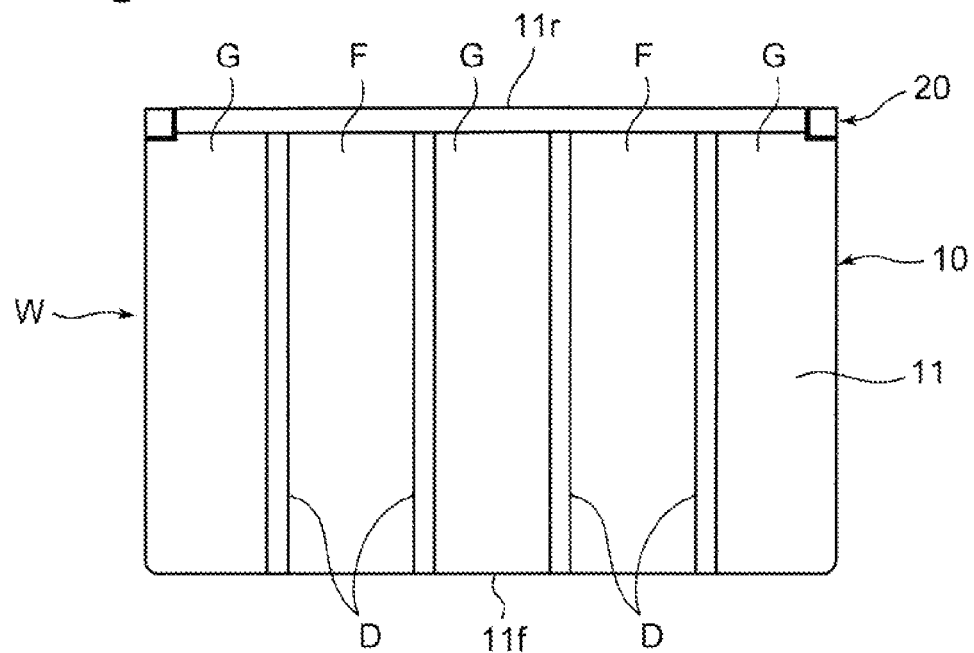
FIG. 4 is a plan view illustrating the laptop PC in an unused state.

More specifically, the first chassis 11 and the second chassis 31 are both formed to have substantially-rectangular basic shapes in their entirety in a plan view, and they are coupled to each other through the hinge mechanism 20 at one sides 11r and 31r of them (namely, their rear sides when viewed from the user of the laptop PC W in an operation state where the user operates the laptop PC W), which enables manipulations for opening and closing both the chassis with respect to each other about a hinge axle 21 (see FIG. 4). Further, in the present specification, the aforementioned term "rectangular" may also include "square", in one aspect.

The first and second chassis 10 and 30 are made of a metal material, in order to ensure that they have required mechanical strengths and rigidity and required electromagnetic shielding properties and, further, so that they are capable of effectively dissipating heat generated inside of the apparatus. In the present embodiment, they are molded by employing magnesium (Mg) as the material, for example, and by injecting the molten material in a molten state or a semi-molten state into predetermined molding dies. For example, it is appropriate to employ so-called thixo-molding process, which is an injection molding process using a molten material made of Mg or an Mg alloy in a semi-molten state.

Particularly, the first chassis 11 which houses the display section 10 in such a way as to cover its rear surface is required to have a high mechanical strength and rigidity which are enough to protect the display section 10 against external pressures, particularly, in addition to an electromagnetic shielding property and a heat dissipation property.

Figure 5:
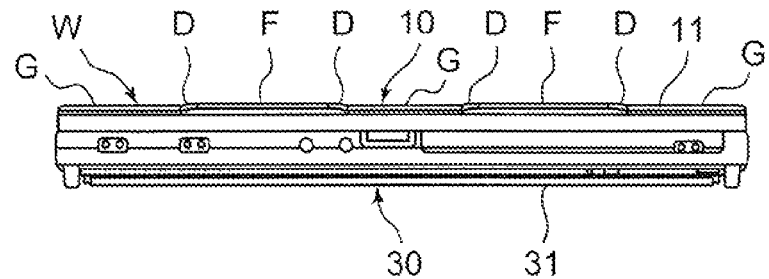
FIG. 5 is a front view illustrating the laptop PC in an unused state.
Figure 6A:
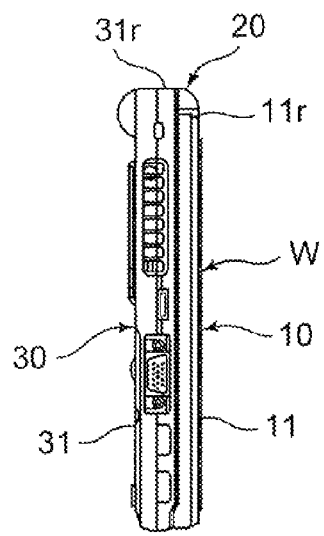
FIG. 6A is a left side view illustrating the laptop PC in an unused state.
Figure 6B:
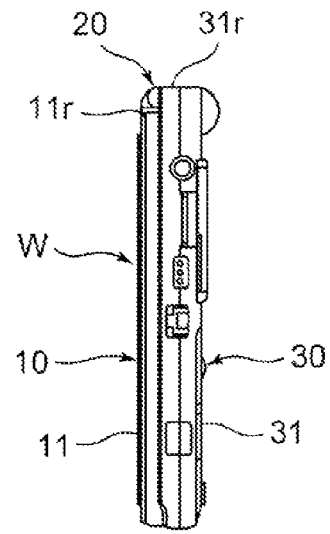
FIG. 6B is a right side view illustrating the laptop PC in an unused state.
Figure 7:
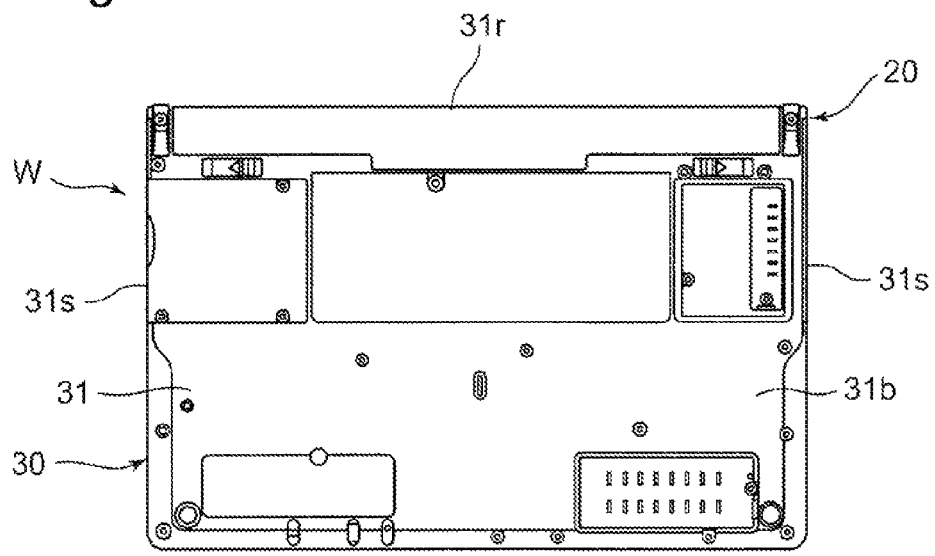
FIG. 7 is a bottom view illustrating the laptop PC in an unused state.

Therefore, as illustrated in FIGS. 2, 4 and 5, in order to enable the first chassis 11 to have required rigidity while having a small thickness, the thin-plate-shaped chassis 11 is provided with a plurality of step portions D extended substantially in parallel with each other in such a way as to form bulge portions F which are bulged in a convex shape. Thus, the first chassis 11 is formed to be of a so-called bonnet like having a basic structure similar to that of an automobile bonnet. In this case, the chassis 11 is provided with four step portions D which are extended in the forward and rearward direction in parallel with each other, and these step portions D partition the chassis 11 into two bulge portions F and three non-bulge portions G. The bulge portions F and the non-bulge portions G are both molded to have thin-plate shapes with predetermined thicknesses.

Regarding to the chassis having this bonnet-like basic structure, in order to further increase the strength and the rigidity of the entire chassis, when an attempt is made to increase the thickness of the step portions for reinforcing them and, thereby the thickened step portions can be caused to play a role as elongated cross rails, this tends to cause differences in the flow velocity of the molten material during the molding, between the thickened step portions D and the other thin-plate portions (the bulge portions F and the non-bulge portions G). That is, the step portions D are extended along the direction of flows of the molten material, and the molten material flows at a relatively-higher velocity along the thickened step portions, while the molten material flows at relatively-lower velocities in the other thin-plate portions. Further, if there is an excessive difference in molten-material flow velocity therebetween, this tends to induce defects such as so-called "shrinkage voids" (partial depressions), in the molded article.

Figure 13:
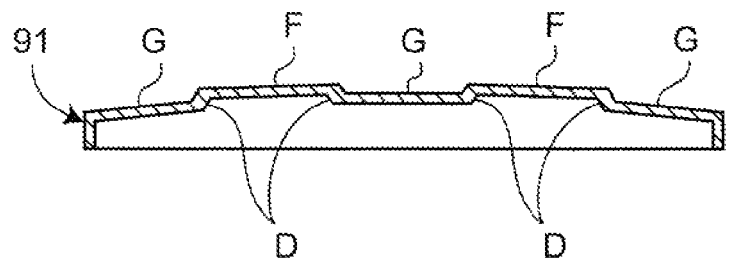
FIG. 13 is a vertical cross-sectional view taken along Y13-Y13 in FIG. 14 and, thus, is a view illustrating the vertical cross-sectional structure of a chassis having simply thickened step portions.
Figure 14:
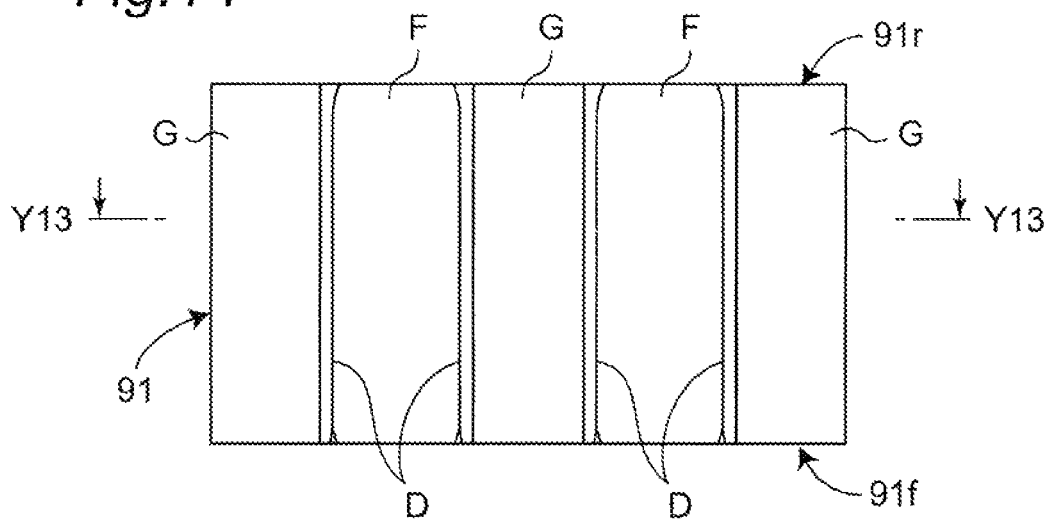
FIG. 14 is a backside view schematically illustrating the chassis having the simply thickened step portions, at its backside surface.

FIG. 14 is a backside view schematically illustrating a chassis 91 having simply thickened step portions D, at its backside surface. FIG. 13 is a vertical cross-sectional view taken along Y13-Y13 in FIG. 14 and, thus, is a view illustrating the vertical cross-sectional structure of the chassis 91 having the simply thickened step portions D. Further, FIG. 15 is an explanatory view schematically illustrating flow velocities of a molten material in respective sections D, F and G, during molding for the chassis 31 in FIGS. 13 and 14.

As can be seen from FIG. 13, the four step portions D which partition the chassis 91 into two bulge portions F and three non-bulge portions G are all designed to have a larger thickness than those of the other thin-plate portions (the bulge portions F and the non-bulge portions G).

Figure 15:
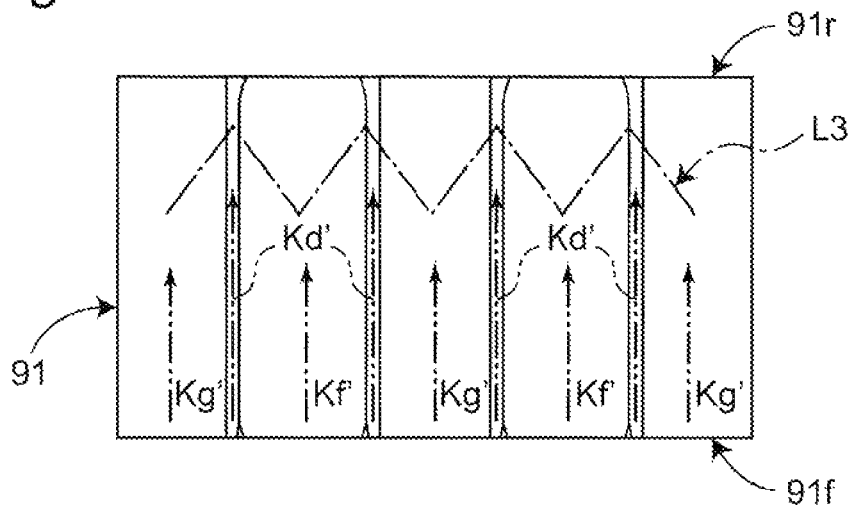
FIG. 15 is an explanatory view schematically illustrating flow velocities of a molten material in respective sections, during molding for the chassis having the simply thickened step portions.

In FIG. 15, arrows of two-dot chain lines Kd', Kf' and Kg' indicate the directions and the velocities of flows of the molten material in the respective sections D, F and G, and a polygonal dashed line L3 indicates the changes of the flow velocity in the respective sections D, F and G.

As can be well seen from FIG. 15, the molten material is injected in the direction from the front side 91f of the chassis 91 to the rear side 91r thereof, for example. Further, as can be seen from the polygonal line L3 in FIG. 15, in the case where the step portions D are merely formed to have the increased thickness, there is a relatively-larger difference in molten-material flow velocity during the molding, between the thickened step portions D and the other thin-plate portions (the bulge portions F and the non-bulge portions G).

In the present embodiment, in order to suppress differences in molten-material flow velocity between the thickened step portions D and the other thin-plate portions F and G, even when the step portions D are made to have a larger thickness than those of the other thin-plate portions (the bulge portions F and the non-bulge portions G), there are provided ribs with a predetermined height which extend from the step portions D to the thin-plate portions F and G.

Hereinafter, referring to FIGS. 8 to 10, the first chassis 11 according to the present embodiment will be described, in detail, with respect to the structure thereof. In the description thereof, for distinctively designating the four step portions D having the increased thickness, they are designated by reference characters D1, D2, D3 and D4 in the mentioned order from the left side of each figure. Further, for distinctively designating the two bulge portions F, they are designated by reference characters F1 and F2, in the mentioned order from the left side of each figure. Further, for distinctively designating the three non-bulge portions G, they are designated by reference characters G1, G2 and G3 in the mentioned order from the left side of each figure.

Figure 8:
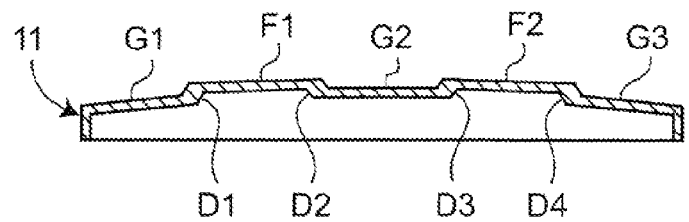
FIG. 8 is a vertical cross-sectional view taken along Y8-Y8 in FIG. 9 and, thus, is a view illustrating the vertical cross-sectional structure of a first chassis in the laptop PC.
Figure 9:
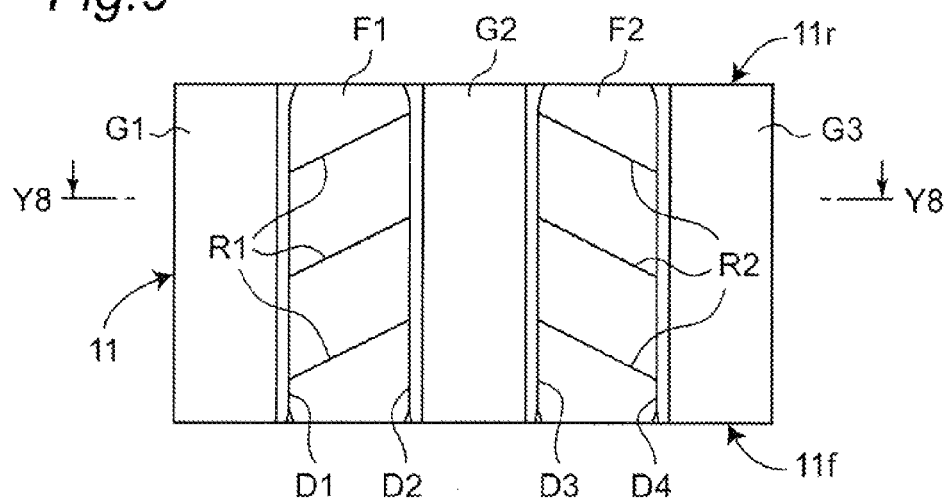
FIG. 9 is a backside view schematically illustrating the first chassis, at its backside surface.

FIG. 9 is a backside view schematically illustrating the first chassis 11 according to the present embodiment, at its backside surface. FIG. 8 is a vertical cross-sectional view taken along Y8-Y8 in FIG. 9 and, thus, is a view illustrating the vertical cross-sectional structure of the first chassis 11. Further, FIG. 10 is an explanatory view schematically illustrating flow velocities of the molten material in the respective sections D1 to D4, F1 to F2, and G1 to G3, during molding for the first chassis 11.

As can be seen from FIG. 8, the four step portions D1 to D4 which partition the chassis 11 into the two bulge portions F1 to F2 and the three non-bulge portions G1 to G3 are all adapted to have a larger thickness than those of the other thin-plate portions (the bulge portions F1 to F2 and the non-bulge portions G1 to G3).

In the present embodiment, for example, the other thin-plate portions (the bulge portions F1 to F2 and the non-bulge portions G1 to G3) are configured to have plate thicknesses in the range of 0.55 to 0.65 mm, and the step portions D1 to D4 are configured to have a plate thickness in the range of 0.9 to 1.0 mm.

Figure 10:
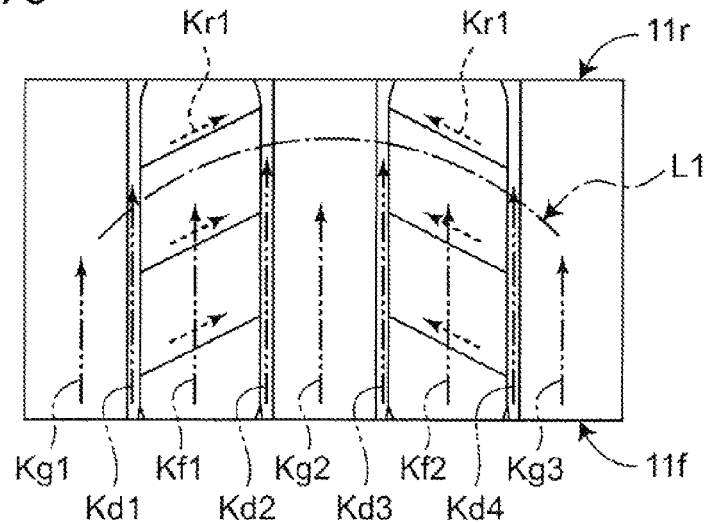
FIG. 10 is an explanatory view schematically illustrating flow velocities of a molten material in respective sections, during molding for the first chassis.

In FIG. 10, arrows of two-dot chain lines Kd1 to Kd4, Kf1 to Kf2, Kg1 to Kg3 designate the directions and the velocities of flows of the molten material in the respective sections D1 to D4, F1 to F2 and G1 to G3, and a curved dashed line L1 designates the changes of the flow velocity in the respective sections. Further, as can be well seen from FIG. 10, the molten material is injected in the direction from the front side 11f of the chassis 11 to the rear side 11r thereof, for example. The step portions D1 to D4 are all extended along the direction of flows of the molten material.

In the present embodiment, for example, the bulge portions F1 and F2 are provided, on their backside surfaces, with three ribs R1 and three ribs R2 with a predetermined height such that they extend between the pairs of the step portions D1 and D2 and between the pairs of the step portions D3 and D4 which respectively form those bulge portions F1 and F2. There are a plurality of ribs R1 and a plurality of ribs R2, for example. Broken-line arrows Kr1 and Kr2 indicate the directions and the velocities of flows of the molten material flowing along the ribs R1 and the ribs R2, respectively.

Since the first chassis 11 which covers the backside surface of the display section 10 is provided with the ribs R1 and the ribs R2 on the backside surfaces of the bulge portions F1 and F2 which have leeway in the space, as described above, it is possible to avoid interference of the ribs R1 and the ribs R2 with the display section 10.

In the present embodiment, for example, the bulge portions F1 and F2 are configured to have a bulge height of about 1 mm on the backside surface, and the ribs R1 and the ribs R2 are configured to have a rib height of about 0.5 mm. It is ideal that the rib height is set to be about 1 mm, which is equal to the bulge height of the bulge portions F1 and F2 on the backside surface, but, in the present embodiment, the rib height is set to be about 0.5 mm as described above, in order to certainly avoid them from interfering with the liquid crystal display panel portion, for example, of the display section 10 covered with the first chassis 11.

The ribs R1 extend in a diagonally rightward and rearward direction with respect to the direction of the extension of the step portion D1 such that they are gradually further spaced apart from the step portion D1 as they proceed in the direction of flows of the molten material. Further, the ribs R2 extend in a diagonally leftward and rearward direction with respect to the direction of the extension of the step portion D4 such that they are gradually farther spaced apart from the step portion D4 as they proceed in the direction of flows of the molten material.

Since the directions of the extensions of the ribs R1 and R2 are set to be those diagonal directions, it is possible to smoothly and dispersedly flow portions of the molten material to the thin-plate portions (the bulge portions F1 and F2), such that the molten material gradually gets farther away from the step portions D1 and D4 as it flows with respect to the thickened step portions D1 and D4 (see FIG. 10: the broken-line arrows Kr1 and Kr2). That is, it is possible to appropriately control flows of the molten material flowing along the thickened step portions D1 and D4.

As can be seen from the curved line L1 in FIG. 10, the molten material which flows along the step portions D1 and D4 has slightly-reduced flow velocities Kd1 and Kd4, since portions of the molten material are smoothly and dispersedly flowed to the thin-plate portions (the bulge portions F1 and F2). This reduces the velocity difference between the adjacent sections G1 and F1 and G2 and F2 by an amount corresponding thereto. Further, in the entire chassis 11, as can be seen from the curved line L1 in FIG. 10, there is a appropriate velocity distribution in which the velocity is slightly higher at the center in the leftward and rightward direction and is moderately and gradually lowered with decreasing distance to the end portions. That is, there is a reduced velocity difference between the adjacent sections, which can suppress the occurrence of defects such as so-called "shrinkage voids".

As described above, according to the present embodiment, since there are provided the ribs R1 and R2 having a predetermined height which extend from the step portions D1 and D4 to the other thin-plate portions F1 and F2, it is possible to cause portions of the molten material flowing along the thickened step portions D1 and D4 to dispersedly flow to the other thin-plate portions F1 and F2. That is, it is possible to reduce the molten-material flow velocity difference between the thickened step portions D1 and D4 and the other thin-plate portions F1 and F2. Further, in the entire chassis 11, it is possible to realize an appropriate velocity distribution having smaller velocity differences between the adjacent sections.

This can effectively suppress the occurrence of defects such as so-called "shrinkage voids" in the molded chassis 11, while causing the thickened step portions D1 and D4 to play a role as elongated cross rails for attaining further enhance the strength and the rigidity of the entire chassis 11. This can further stabilize the fabrication processes for the chassis 11.

Next, with reference to FIG. 11 and FIG. 12, another embodiment (a second embodiment) of the present disclosure will be described.

Figure 11:
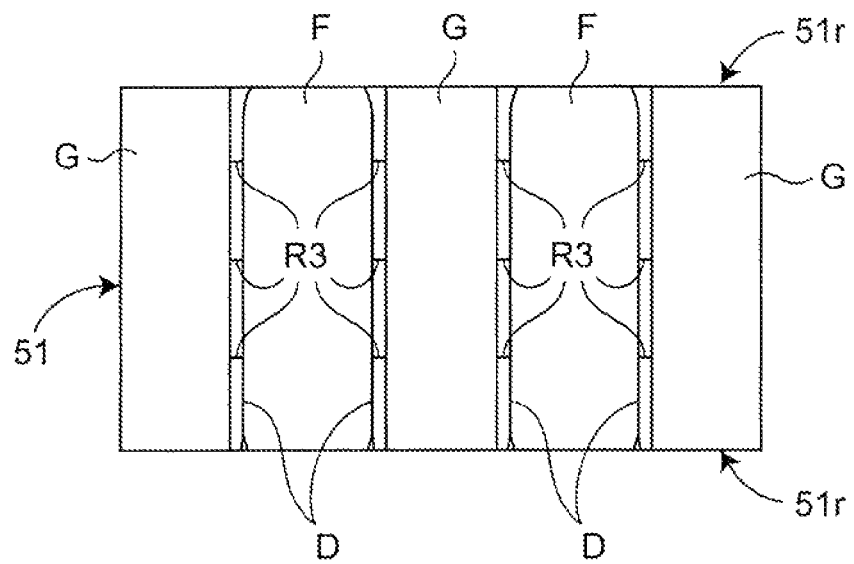
FIG. 11 is a backside view schematically illustrating a first chassis according to a second embodiment of the present disclosure, at its backside surface.

FIG. 11 is a backside view schematically illustrating a chassis 51 according to the second embodiment of the present disclosure, at its backside surface. Further, FIG. 12 is an explanatory view schematically illustrating flow velocities of a molten material in respective sections D, F and G, during molding for the first chassis 51. Further, illustration of the vertical cross-sectional structure of the chassis 51 is omitted, since it is the same as that in FIG. 13 described above. Further, in the following description, components having the same structures and the same functions as those described with reference to FIGS. 13 to 15 will be designated by the same reference characters and will not be described redundantly.

Figure 12:
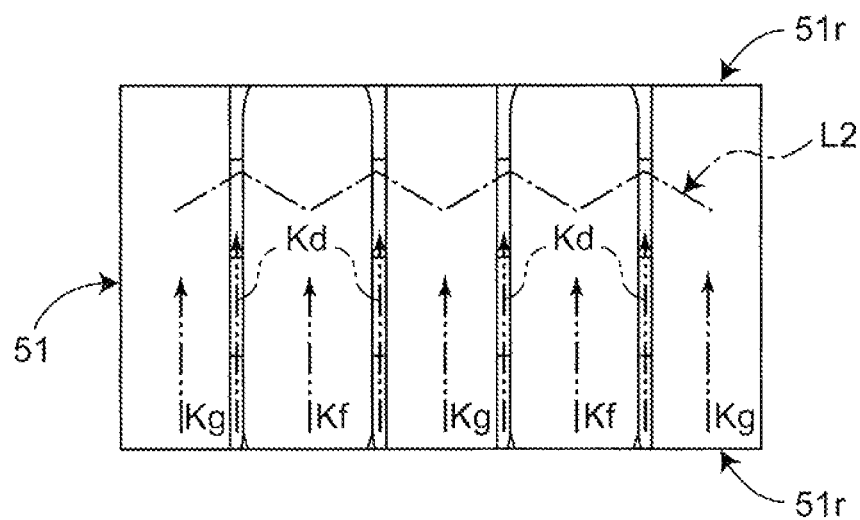
FIG. 12 is an explanatory view schematically illustrating flow velocities of a molten material in respective sections, during molding for the first chassis according to the second embodiment.

In FIG. 12, arrows of two-dot chain lines Kd, Kf and Kg indicate the directions and the velocities of flows of the molten material in the respective sections D, F and G, and a polygonal dashed line L2 indicates the change of the flow velocity in the respective sections D, F and G.

Further, as can be well seen from FIG. 12, the molten material is injected in the direction from the front side 51f of the chassis 51 to the rear side 51r thereof, for example. Further, respective step portions D are all extended along the direction of flows of the molten material.

In the present embodiment, in order to suppress differences in flow velocities of the molten material between the thickened step portions D and the other thin-plate portions F and G, even when the step portions D are made to have a larger thickness than those of the other thin-plate portions (the bulge portions F and the non-bulge portions G), the respective step portions D are provided with ribs R3 with a predetermined height which extend in a direction intersecting with the direction of the extension of the step portions and, for example, in the direction orthogonal to that of the extension thereof, at three positions. The height of the ribs R3 is appropriately set within a range which can avoid them from interfering with the display section 10.

In the present embodiment, the plate thicknesses of the other thin-plate portions (the bulge portions F and the non-bulge portions G), the plate thickness of the step portions D, the bulge height of the bulge portions F on the backside surface, and the rib height of the ribs R3 are set to be the same as those in the first embodiment, for example.

As described above, the respective ribs R3 are provided on the step portions D such that they extend in a direction intersecting with the direction of the extension of the step portions D. The ribs R3 obstruct, to some degree, flows of the molten material flowing along the thickened step portions D, during the molding. Consequently, portions of the flowing molten material can be dispersedly flowed to the other thin-plate portions (the bulge portions F and the non-bulge portions G). That is, it is possible to reduce the molten-material flow-velocity difference between the thickened step portions D and the other thin-plate portions F and G.

Particularly, since the ribs R3 are provided such that they extend in the direction orthogonal to the direction of the extension of the step portions D, it is possible to effectively obstruct flows of the molten material flowing along the thickened step portions D. This enables to reduce the height of the ribs R3 by an amount corresponding thereto. Thereby, it is possible to suppress that the thickness reduction in the chassis 51 is obstructed by providing the ribs R3 provided on the step portions D.

As can be seen from the curved line L2 in FIG. 12, the molten material which flows along the step portions D has a slightly-lowered flow velocity Kd, since portions of the molten material dispersedly flow to the thin-plate portions (the bulge portions F and the non-bulge portions G). This reduces the velocity differences between the adjacent sections F and G. Further, in the entire chassis 51, as can be seen by comparing the curved line L2 in FIG. 12 with the curved line L3 in FIG. 15, there are reduced velocity differences between the adjacent sections, which can suppress the occurrence of defects such as so-called "shrinkage voids".

As described above, in the present embodiment, the step portions 3D are provided with the ribs R3 having a predetermined height which extend in a direction intersecting with the direction of the extension of the step portions D. Consequently, the ribs R3 obstruct, to some degree, flows of the molten material flowing along the thickened step portions D, during the molding. Consequently, portions of the flowing molten material can be dispersedly flowed to the other thin-plate portions F and G. That is, it is possible to reduce the molten-material flow-velocity difference between the thickened step portions D and the other thin-plate portions F and G.

Accordingly, similarly to in the first embodiment, it is possible to effectively suppress the occurrence of defects such as so-called "shrinkage voids" in the molded chassis 51, while causing the thickened step portions D to play a role as elongated cross rails for attaining further improvement in the strength and the rigidity of the entire chassis 51. This can further stabilize the fabrication processes for the chassis 51.

Further, the ribs R3 provided on the step portions D according to the second embodiment can be also provided on the step portions D1 to D4 according to the first embodiment. In this case, it is possible to offer the effects of the second embodiment, in addition to the effects of the first embodiment, which can further reduce the molten-material flow velocity differences between the thickened step portions D1 and D4 and the other thin-plate portions F1 and F2, thereby realizing a more-appropriate velocity distribution having further-reduced velocity differences between the adjacent sections, in the entire chassis 11.

Furthermore, in the aforementioned embodiments, magnesium or an alloy thereof is employed as the materials of the chassis 11 and 51. However, instead thereof, it is also possible to employ other light metals or alloys thereof, such as aluminum or alloys thereof. Further, the present disclosure can be also effectively applied to cases of employing other types of metal materials or resin materials.

Still further, the aforementioned description has been given by exemplifying an upper chassis (a first chassis) which houses a display section of a laptop PC in such a way as to cover its rear surface, the present disclosure can be similarly applied to a lower chassis (a second chassis) which houses the operation control section in such a way as to cover its rear surface.

Still further, while the aforementioned description has been given by exemplifying a chassis of a laptop PC, the present disclosure is not limited to this case and can be also effectively applied to chassis of other various types of electronic apparatuses.

As described above, the present disclosure is not limited to the embodiments and the modification examples which have been described above, and various types of changes and improvements in designs can be also made thereto, without departing from the spirits thereof.

The present disclosure can be effectively utilized, as chassis of electronic apparatuses, such as laptop PCs, for example.

What is claimed is:

1. A thin-plate-shaped chassis for an electronic apparatus, comprising:
    at least one bulge portion;
    non-bulge portions located at both sides of the bulge portion; and
    a plurality of step portions located between the bulge portion and the respective non-bulge portions and extended substantially in parallel with each other in such a way as to form the bulge portion which is bulged in a convex shape,
    wherein the step portions are formed to have a larger thickness than those of the bulge portion and the non-bulge portions, and
    wherein there is provided at least one rib having a predetermined height on a backside surface of the bulge portion, which extends between adjacent step portions.

2. The chassis for the electronic apparatus according to claim 1, wherein the chassis is molded by injecting a molten material in a molten state or a semi-molten state into a predetermined molding die, and the step portions are extended along a direction of flow of the molten material.

3. The chassis for the electronic apparatus according to claim 2, wherein the molten material is a material selected from a material group including aluminum, alloys of aluminum, magnesium, and alloys of magnesium.

4. The chassis for the electronic apparatus according to claim 2, wherein the rib extends in a diagonal direction with respect to a direction of extension of the step portions such that the rib is gradually further spaced apart from the step portion as it proceeds in the direction of the flow of the molten material.

5. The chassis for the electronic apparatus according to claim 4, wherein the molten material is a material selected from a material group including aluminum, alloys of aluminum, magnesium, and alloys of magnesium.

6. The chassis for the electronic apparatus according to claim 1, wherein the predetermined height of the rib is equal to or smaller than a bulge height of the bulge portion.

7. The chassis for the electronic apparatus according to claim 1, wherein a direction along which the ribs extend is diagonal with respect to a direction along which the step portions extend.

8. The chassis for the electronic apparatus according to claim 1, wherein the electronic apparatus is a laptop computer.

9. The chassis for the electronic apparatus according to claim 1, wherein the chassis comprises:
   a display-portion-side chassis;
   an operation-control-section-side chassis; and
   a hinge mechanism connected to the display-portion-side chassis and the operation-control-section-side chassis.

10. A thin-plate shaped chassis for an electronic apparatus, comprising:
   at least one bulge portion;
   non-bulge portions located at both sides of the bulge portion; and
   a plurality of step portions located between the bulge portion and the respective non-bulge portions and extended substantially in parallel with each other in such a way as to form the bulge portion which is bulged in a convex shape,
   wherein the step portions are formed to have a larger thickness than those of the bulge portion and the non-bulge portions, and
   wherein each step portion is provided with at least one rib having a predetermined height on a backside surface of each step portion, which extends in a direction intersecting with the direction of extension of the step portion.

11. The chassis for the electronic apparatus according to claim 10, wherein the chassis is molded by injecting a molten material in a molten state or a semi-molten state into a predetermined molding die, and the step portions are extended along a direction of flow of the molten material.

12. The chassis for the electronic apparatus according to claim 11, wherein the molten material is a material selected from a material group including aluminum, alloys of aluminum, magnesium, and alloys of magnesium.

13. The chassis for the electronic apparatus according to claim 10, wherein the rib extends in a direction orthogonal to a direction of extension of the step portions.

14. The chassis for the electronic apparatus according to claim 13, wherein the molten material is a material selected from a material group including aluminum, alloys of aluminum, magnesium, and alloys of magnesium.

15. The chassis for the electronic apparatus according to claim 10, wherein the electronic apparatus is a laptop computer.

16. The chassis for the electronic apparatus according to claim 10, wherein the chassis comprises:
   a display-portion-side chassis;
   an operation-control-section-side chassis; and
a hinge mechanism connected to the display-portion-side chassis and the operation-control-section-side chassis.

* * * * *